(12) United States Patent
Kuo et al.

(10) Patent No.: US 12,315,809 B2
(45) Date of Patent: May 27, 2025

(54) VIA FOR SEMICONDUCTOR DEVICE AND METHOD

(71) Applicant: Taiwan Semiconductor Manufacturing Co., Ltd., Hsinchu (TW)

(72) Inventors: Chia-Pang Kuo, Taoyuan (TW);
Chih-Yi Chang, New Taipei (TW);
Ming-Hsiao Hsieh, Hsinchu (TW);
Wei-Hsiang Chan, Hsinchu (TW);
Ya-Lien Lee, Baoshan Township (TW);
Chien Chung Huang, Taichung (TW);
Chun-Chieh Lin, Taichung (TW);
Hung-Wen Su, Jhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/358,803

(22) Filed: Jul. 25, 2023

(65) Prior Publication Data

US 2023/0369224 A1    Nov. 16, 2023

Related U.S. Application Data

(63) Continuation of application No. 17/001,917, filed on Aug. 25, 2020, now Pat. No. 11,810,857.

(51) Int. Cl.
*H01L 23/532*   (2006.01)
*H01L 21/768*   (2006.01)

(52) U.S. Cl.
CPC .. *H01L 23/53238* (2013.01); *H01L 21/76804* (2013.01); *H01L 21/76846* (2013.01); *H01L 21/76877* (2013.01)

(58) Field of Classification Search
CPC ......... H01L 23/53238; H01L 23/53261; H01L 21/76804; H01L 21/76846; H01L 21/76877; H01L 23/53266
See application file for complete search history.

(56) References Cited

U.S. PATENT DOCUMENTS

| | | | |
|---|---|---|---|
| 7,651,943 | B2 | 1/2010 | Yu et al. |
| 9,105,490 | B2 | 8/2015 | Wang et al. |
| 9,236,267 | B2 | 1/2016 | De et al. |
| 9,236,300 | B2 | 1/2016 | Liaw |

(Continued)

FOREIGN PATENT DOCUMENTS

| | | |
|---|---|---|
| CN | 102376641 A | 3/2012 |
| KR | 20200037053 A | 4/2020 |
| TW | 202029410 A | 8/2020 |

*Primary Examiner* — Phat X Cao
(74) *Attorney, Agent, or Firm* — Slater Matsil, LLP

(57) ABSTRACT

A structure includes a first conductive feature in a first dielectric layer; a second dielectric layer over the first dielectric layer; and a second conductive feature extending through the second dielectric layer to physically contact the first conductive feature, wherein the second conductive feature includes a metal adhesion layer over and physically contacting the first conductive feature; a barrier layer extending along sidewalls of the second dielectric layer; and a conductive filling material extending over the metal adhesion layer and the barrier layer, wherein a portion of the conductive filling material extends between the barrier layer and the metal adhesion layer.

20 Claims, 19 Drawing Sheets

(56) References Cited

U.S. PATENT DOCUMENTS

| | | |
|---|---|---|
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,589,836 B1 * | 3/2017 | Zhang .................. H01L 23/528 |
| 9,831,183 B2 | 11/2017 | Lin et al. |
| 9,859,386 B2 | 1/2018 | Ho et al. |
| 2001/0030367 A1 | 10/2001 | Noguchi et al. |
| 2005/0127511 A1 | 6/2005 | Yang et al. |
| 2006/0246699 A1 | 11/2006 | Weidman et al. |
| 2008/0132057 A1 | 6/2008 | Feustel et al. |
| 2009/0209099 A1 | 8/2009 | Yu et al. |
| 2010/0078818 A1 | 4/2010 | Ishizaka et al. |
| 2010/0078821 A1 | 4/2010 | Kahlert et al. |
| 2010/0081274 A1 | 4/2010 | Ishizaka et al. |
| 2014/0357078 A1 | 12/2014 | Zhang et al. |
| 2015/0214093 A1 | 7/2015 | Dordi et al. |
| 2015/0270156 A1 | 9/2015 | Lin |
| 2016/0126190 A1 | 5/2016 | Zhang et al. |
| 2020/0105592 A1 | 4/2020 | Kuo et al. |
| 2020/0144107 A1 * | 5/2020 | Dutta ................ H01L 21/76816 |
| 2021/0287994 A1 | 9/2021 | Hsueh et al. |

* cited by examiner

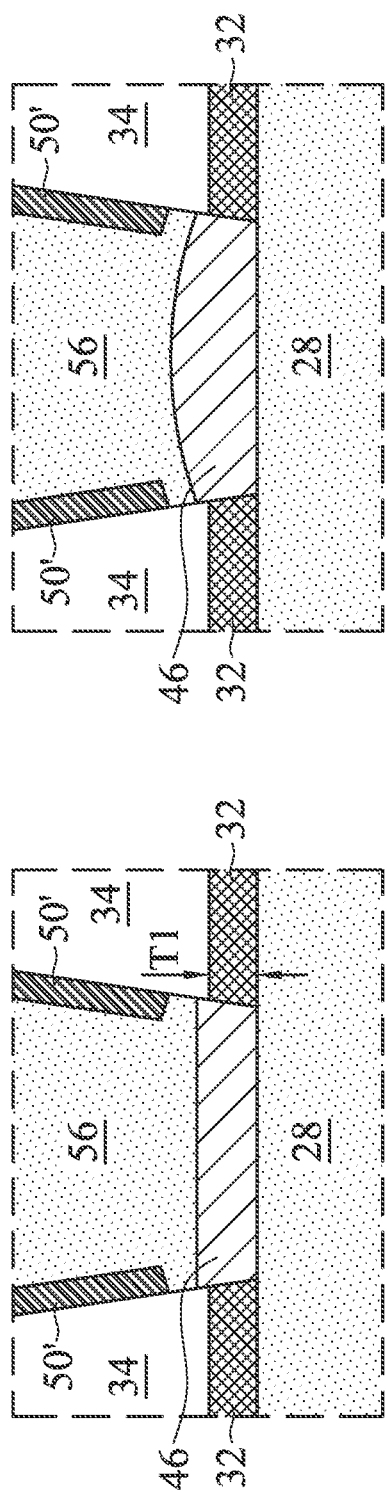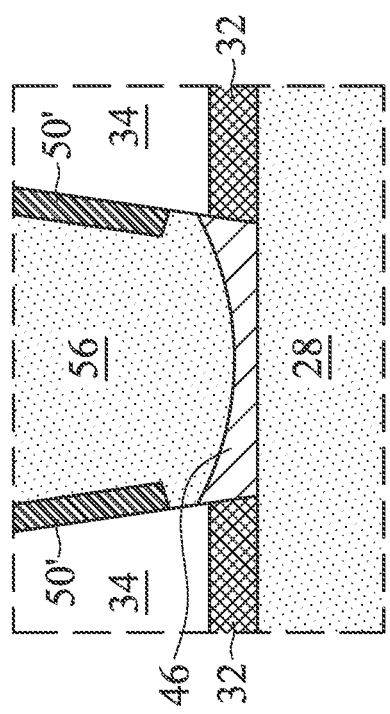
FIG. 17A  FIG. 17B  FIG. 17C

VIA FOR SEMICONDUCTOR DEVICE AND METHOD

PRIORITY CLAIM AND CROSS-REFERENCE

This application is a continuation of U.S. patent application Ser. No. 17/001,917, filed on Aug. 25, 2020, which application is incorporated herein by reference.

BACKGROUND

Integrated circuits include interconnect structures, which comprise metal lines and vias to serve as three-dimensional wiring structures. The function of the interconnect structures is to properly connect densely packed devices together.

Metal lines and vias are formed in the interconnect structure. Metal lines and vias are typically formed by damascene processes, in which trenches and via openings are formed in dielectric layers. A barrier layer is then deposited, followed by the filling of the trenches and via openings with copper. After a Chemical Mechanical Polish (CMP) process, the top surfaces of the metal lines are leveled, leaving metal lines and vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 17A-C and 18 illustrate the cross-sectional views of intermediate stages in the formation of various vias, in accordance with some embodiments.

DETAILED DESCRIPTION

Figure 1:
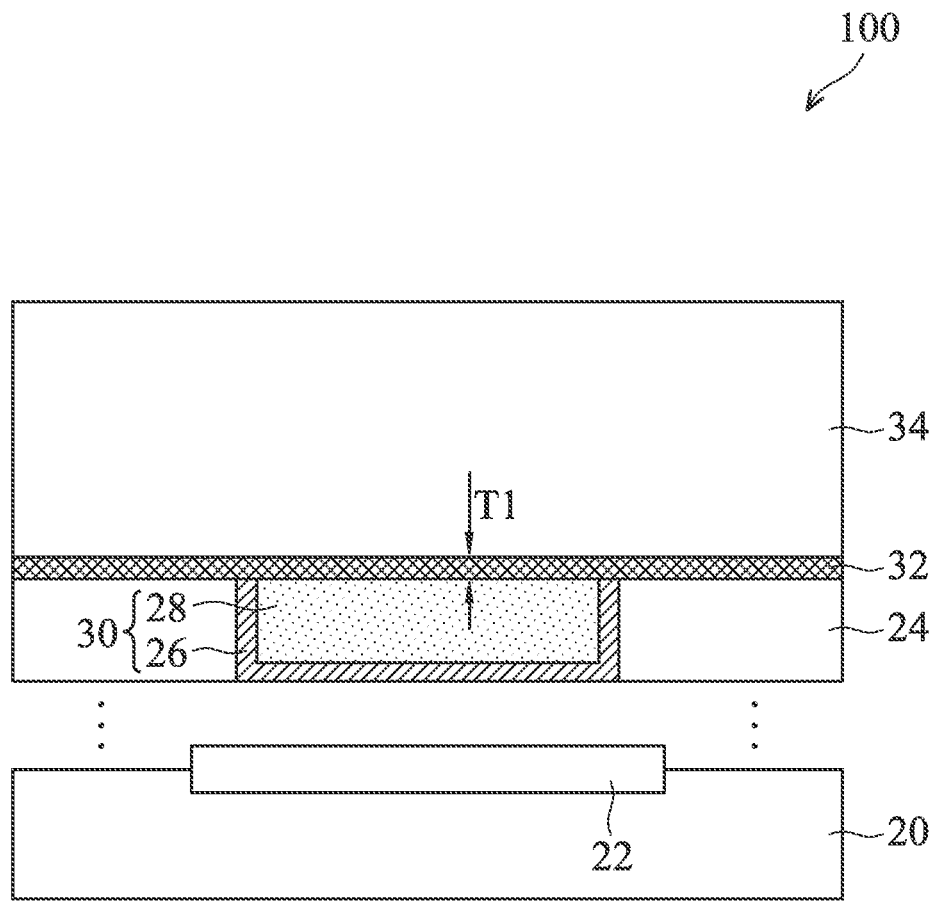
FIGS. 1 through 10 illustrate the cross-sectional views of intermediate stages in the formation of a via, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of selectively forming an adhesion layer for a conductive feature is provided in accordance with various embodiments. The intermediate stages in the formation of the conductive feature are illustrated in accordance with some embodiments. Some variations of some embodiments are discussed. Throughout the various views and illustrative embodiments, like reference numbers are used to designate like elements. In accordance with some embodiments of the present disclosure, the formation of the adhesion layer includes depositing the material of the adhesion layer on an underlying conductive feature exposed by an opening. A barrier layer is formed on sidewalls of the opening and blocked from being formed on the adhesion layer by a sacrificial layer. The sacrificial layer resists adhesion of the barrier layer material such that the barrier layer is selectively grown on the sidewalls of the opening, with little or no barrier layer being formed on the sacrificial layer. After the barrier layer is formed, the sacrificial layer is removed. The opening is then filled with a metallic material such as copper, which is formed on the adhesion layer. In this manner, a conductive feature (e.g., a via) may be formed on another conductive feature (e.g., a metal line). By forming the adhesion layer on the underlying conductive feature, the thermal stability of the interface may be improved. Additionally, by blocking the formation of the barrier layer on the adhesion layer, the resistance of the interface may be reduced. Thus, the yield and the performance may be improved for a semiconductor device formed using the techniques described herein.

FIG. 1 illustrates a cross-sectional view of a package component 100, in accordance with some embodiments of the present disclosure. The package component 100 may be a device wafer (such as a logic device wafer) including active devices such as transistors and/or diodes, and may include passive devices such as capacitors, inductors, resistors, or the like. In accordance with alternative embodiments of the present disclosure, the package component 100 is an interposer wafer, which may or may not include active devices and/or passive devices. In accordance with yet alternative embodiments of the present disclosure, the package component 100 is a package substrate strip, which may include package substrates with cores therein or core-less package substrates. In subsequent discussion, a device wafer is used as an example of the package component 100. The teaching of the present disclosure may also be applied to interposer wafers, package substrates, packages, etc.

In accordance with some embodiments of the present disclosure, the package component 100 includes a semiconductor substrate 20 and features formed at a top surface of the semiconductor substrate 20. The semiconductor substrate 20 may comprise crystalline silicon, crystalline germanium, silicon germanium, a III-V compound semiconductor such as GaAsP, AlInAs, AlGaAs, GaInAs, GaInP, GaInAsP, the like, or combinations thereof. The semiconductor substrate 20 may also be a bulk silicon substrate or a Silicon-On-Insulator (SOI) substrate, in some embodiments. Shallow Trench Isolation (STI) regions (not shown) may be formed in the semiconductor substrate 20 to isolate the active regions in the semiconductor substrate 20. Although not shown, through-vias may be formed extending into the semiconductor substrate 20 to electrically interconnect features on opposite sides of the package component 100.

In accordance with some embodiments of the present disclosure, the package component 100 is used to form a device die. In these embodiments, integrated circuit devices 22 are formed on a top surface of the semiconductor substrate 20. Example integrated circuit devices 22 include Complementary Metal-Oxide Semiconductor (CMOS) transistors, resistors, capacitors, diodes, or the like. The details of the integrated circuit devices 22 are not illustrated herein. In accordance with alternative embodiments, the package component 100 is used for forming interposers. In accordance with these embodiments, the substrate 20 may also be, for example, a dielectric substrate.

Further illustrated in FIG. 1 is a dielectric layer 24. The dielectric layer 24 may be, for example, an Inter-Layer Dielectric (ILD) or an Inter-Metal Dielectric (IMD). In accordance with some embodiments of the present disclosure, the dielectric layer 24 is an ILD, in which contact plugs are formed. The corresponding dielectric layer 24 may be formed of Phospho Silicate Glass (PSG), Boro Silicate Glass (BSG), Boron-Doped Phospho Silicate Glass (BPSG), Fluorine-Doped Silicate Glass (FSG), a silicon oxide layer (formed using Tetra Ethyl Ortho Silicate (TEOS)), the like, or combinations thereof. The dielectric layer 24 may be formed using spin-on coating, Atomic Layer deposition (ALD), Flowable Chemical Vapor Deposition (FCVD), Chemical Vapor Deposition (CVD), Plasma-Enhanced Chemical Vapor Deposition (PECVD), Low-Pressure Chemical Vapor Deposition (LPCVD), or the like. In accordance with some embodiments of the present disclosure, the dielectric layer 24 is an IMD, in which metal lines and/or vias are formed. The corresponding dielectric layer 24 may be formed of a carbon-containing low-k dielectric material, Hydrogen SilsesQuioxane (HSQ), MethylSilsesQuioxane (MSQ), another low-k dielectric material, the like, or combinations thereof. In accordance with some embodiments of the present disclosure, the formation of the dielectric layer 24 includes depositing a porogen-containing dielectric material and then performing a curing process to drive out the porogen to form a dielectric layer 24 that is porous. The dielectric layer 24 may be formed on the integrated circuit devices 22, or any number of dielectric layers and/or metallization layers may be present between the integrated circuit devices 22 and the dielectric layer 24.

Still referring to FIG. 1, a conductive feature 30 is formed in the dielectric layer 24. The conductive feature 30 may be a metal line, a conductive via, a contact plug, or the like. In accordance with some embodiments, the conductive feature 30 includes a diffusion barrier layer 26 and a conductive filling material 28 over the diffusion barrier layer 26. The diffusion barrier layer 26 may be formed of a conductive material such as titanium, titanium nitride, tantalum, tantalum nitride, the like, or combinations thereof. The conductive filling material 28 may be formed of copper, a copper alloy, aluminum, ruthenium, another metal or metal alloy, the like, or combinations thereof. The diffusion barrier layer 26 has the function of preventing the diffusion of the conductive material (such as copper) of the conductive filling material 28 from diffusing into the dielectric layer 24. In accordance with some embodiments of the present disclosure, the formation of the conductive feature 30 may also adopt the techniques as discussed subsequently, such that the conductive feature 30 is formed on a metal adhesion layer, which may be similar to the metal adhesion layer 46 (see FIG. 6), and/or such that the bottom portion of the diffusion barrier layer 26 is not formed.

As also shown in FIG. 1, an etch stop layer 32 is formed over the dielectric layer 24 and the conductive feature 30, in accordance with some embodiments. The etch stop layer 32 is formed of a dielectric material, which may include one or more materials such as aluminum oxide, aluminum nitride, a silicon oxide, a silicon nitride, silicon carbide, silicon oxynitride, silicon carbonitride, silicon oxycarbonitride, the like, or combinations thereof. The etch stop layer 32 may be formed of a material that has a high etching selectivity relative to the overlying dielectric layer 34 such that an etching of the dielectric layer 34 may stop on the etch stop layer 32. In some embodiments, the etch stop layer 32 may have a thickness T1 that is between about 2 nm and about 5 nm.

Still referring to FIG. 1, a dielectric layer 34 is formed over the etch stop layer 32. In some embodiments, the dielectric layer 34 is an IMD or an ILD. The dielectric layer 34 may comprise a dielectric material such as an oxide, a nitride, a carbon-containing dielectric material, the like, or combinations thereof. For example, the dielectric layer 34 may be formed of PSG, BSG, BPSG, FSG, TEOS oxide, HSQ, MSQ, the like, or combinations thereof. In some embodiments, the dielectric layer 34 is a low-k dielectric layer having a dielectric constant value (k) that is lower than about 3.5 or that is lower than about 3.0.

FIGS. 2 through 10 illustrate a first process for forming a via 58 with a metal adhesion layer 46 (see FIG. 10), in accordance with some embodiments. The examples shown in these and other figures show the formation of a via 58, but the techniques described herein may be used to form other conductive features such as metal lines or the like, and all such conductive features are considered within the scope of this disclosure. It is also appreciated that the examples as shown in these figures describe a damascene process, but in other embodiments, a dual damascene process, in which a metal line, a via, a contact plug, or the like, is formed, is also contemplated. Additional dielectric layers may be formed and the process described in FIGS. 2-10 may be repeated to form additional layers of metallization (e.g., metals lines and vias). In this manner, the process described herein may be used to form an interconnect structure or the like.

Figure 2:
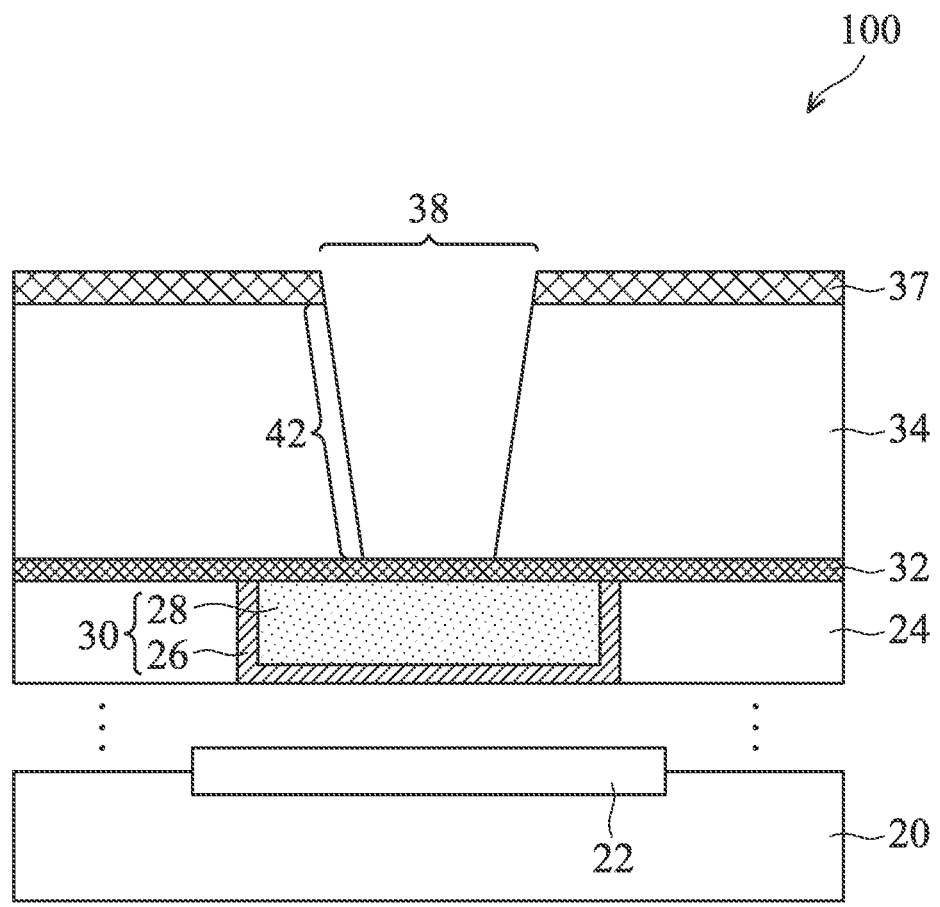

In FIG. 2, a via opening 42 is formed in the dielectric layer 34, in accordance with some embodiments. The via opening 42 may be formed using, for example, suitable photolithography and etching techniques. In an example of a process of forming the via opening 42, a metal hard mask 37 is first formed over the dielectric layer 34 and then patterned to form an opening 38, as shown in FIG. 2. The metal hard mask 37 may be formed of a material such as titanium nitride, boron nitride, another metal oxide or metal nitride, the like, or a combination thereof. The opening 38 in the metal hard mask 37 defines the pattern of a via (e.g., via opening 42 shown in FIG. 2) that is subsequently filled to form a via (e.g., via 58 shown in FIG. 10). In other embodiments, a photoresist structure may be formed over the dielectric layer 34 and patterned to form an opening that defines the pattern of a via.

The exposed dielectric layer 34 may then be etched to form an opening 42 extending into the dielectric layer 34 that exposes the etch stop layer 32, as shown in FIG. 2. The etching of the dielectric layer 34 may be performed using a wet etching process and/or a dry etching process (e.g., a plasma etching process). For example, the etching of the dielectric layer 34 may be performed using a process gas comprising fluorine and carbon, wherein fluorine is used for etching, with carbon having the effect of protecting the sidewalls of the resulting opening. With an appropriate fluorine and carbon ratio, the opening 42 may be formed having a desired profile. For example, the process gases for the etching may include one or more fluorine and carbon-containing gases such as $C_4F_8$, $CH_2F_2$, $CF_4$, or the like, and may include one or more carrier gases such as Ar, $N_2$, or the like. In an example of an etching process, the flow rate of $C_4F_8$ is in the range between about 0 sccm and about 50 sccm, the flow rate of $CF_4$ is in the range between about 0 sccm and about 300 sccm (with at least one of $C_4F_8$ having a non-zero flow rate), and the flow rate of $N_2$ is in the range between about 0 sccm and about 200 sccm. As an additional example, the process gases for the etching may include $CH_2F_2$ and a carrier gas such as $N_2$. The flow rate of $CH_2F_2$ may be in the range between about 10 sccm and about 200 sccm, and the flow rate of $N_2$ may be in the range between about 50 sccm and about 100 sccm. During the etching process, package component 100 may be kept at a temperature in the range between about 30° C. and about 60° C. In the etching process, plasma may be generated from the etching gases. The Radio Frequency (RF) power of the power source for the etching may be lower than about 700 Watts, and the pressure of the process gases is in the range from about 15 mTorr and about 30 mTorr. These are examples, and other etching processes or etching parameters are possible.

Figure 3:
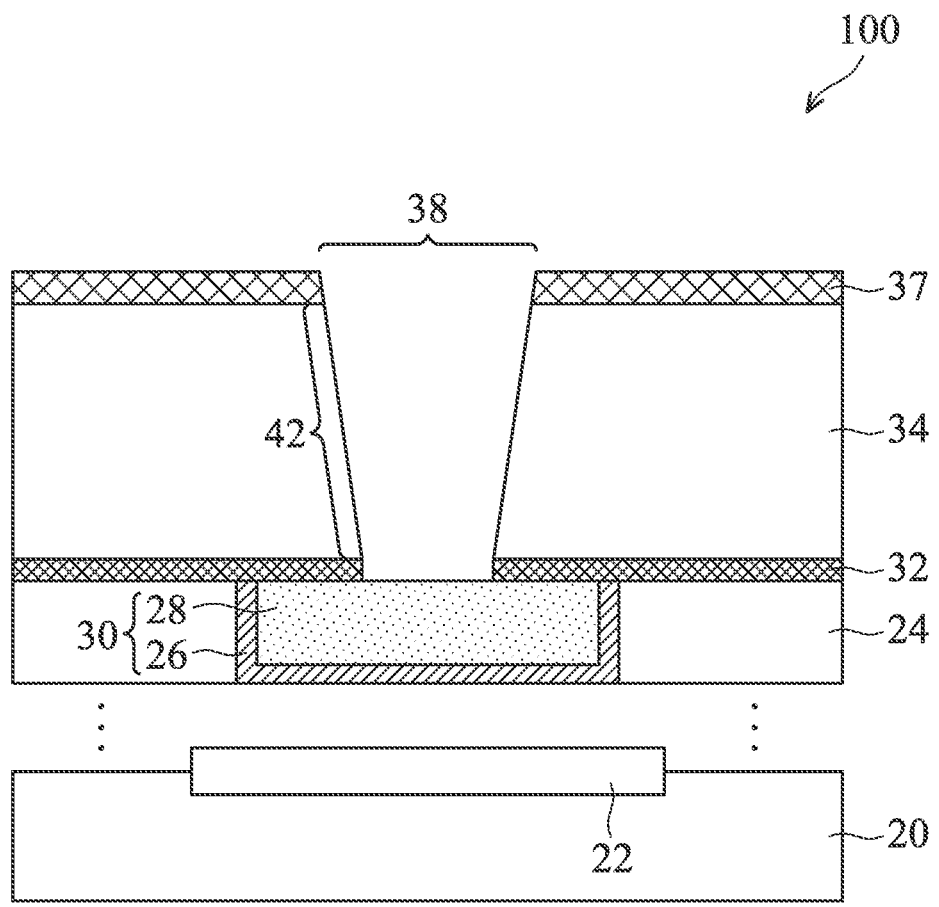

Next, referring to FIG. 3, an etching process is performed to etch through the etch stop layer 32 and expose the conductive filling material 28. In some cases, the etching process may also be referred to as a wet clean process when the etching of the etch stop layer 32 includes a wet etching process. In accordance with some embodiments of the present disclosure, the etching process uses a solution that includes glycol, dimethyl sulfide, amine, $H_2O_2$, the like, or combinations thereof. For example, glycol may be used as a surfactant, dimethyl sulfide may be used as a solvent, amine may be used to remove undesirable organic residue on surfaces of the package component 100, and/or a combination of $H_2O_2$ and amine may be used to etch the etch stop layer 32.

Figure 4:
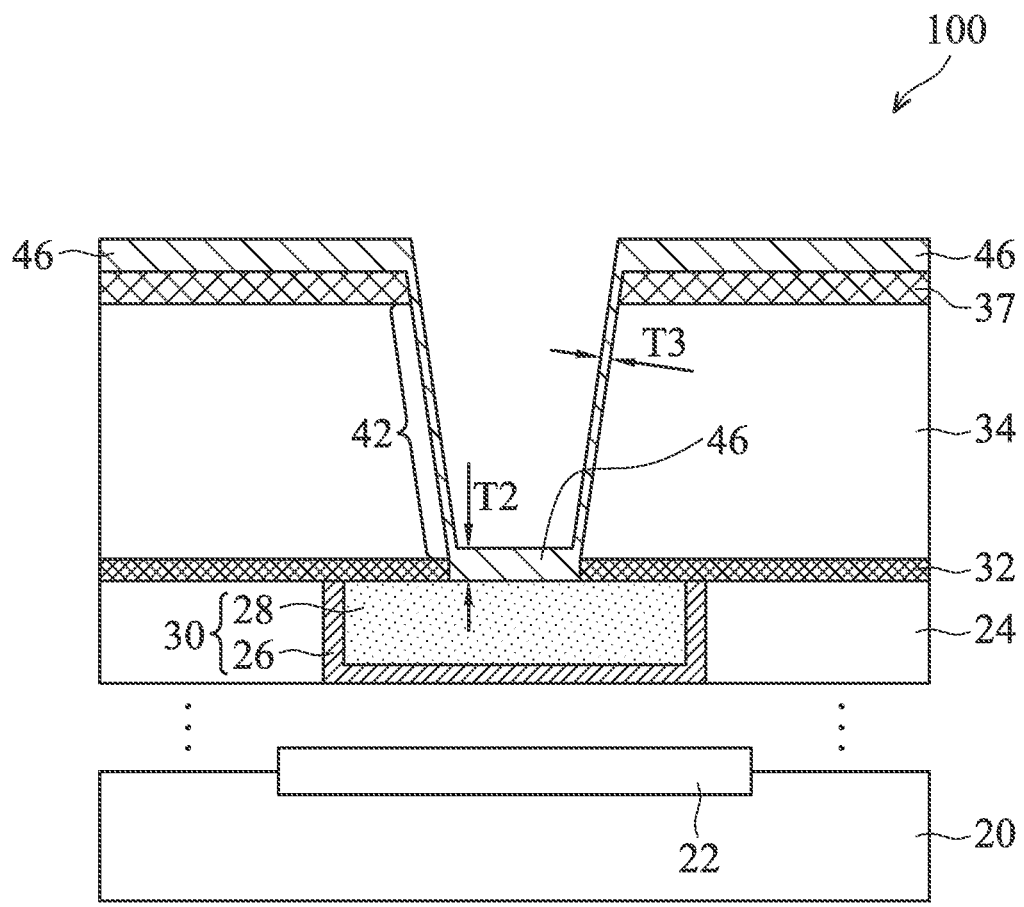

Turning to FIG. 4, a metal adhesion layer 46 is deposited on the exposed surface of the conductive filling material 28, in accordance with some embodiments. As shown in FIG. 4, the metal adhesion layer 46 may be deposited as a blanket layer or a conformal layer within the via opening 42 and on the metal hard mask 37 (when present). The metal adhesion layer 46 has the function of improving the adhesion between a first conductive feature (e.g., the conductive filling material 28) and a second conductive feature (e.g., the conductive material 56 shown in FIG. 9). For example, the metal adhesion layer 46 can improve the interface between conductive features when a barrier layer (e.g., the diffusion barrier layer 26 or the barrier layer 50 shown in FIG. 7) is not present between the conductive features. In some cases, the use of the metal adhesion layer 46 can improve the thermal stability of the interface between the conductive features, which reduces the chance of the interface degrading or separating (e.g., "pull-up"). In this manner, the yield or the reliability of the connection between conductive features can be improved.

In some embodiments, the metal adhesion layer 46 may be a material such as cobalt, ruthenium, manganese, the like, or a combination thereof. For example, the metal adhesion layer 46 may be cobalt formed over a conductive filling material 28 of copper or may be manganese formed over a conductive filling material 28 of ruthenium, though other materials may be used for the metal adhesion layer 46 and/or the conductive filling material 28 than these examples. The metal adhesion layer 46 may be deposited using a suitable technique, such as physical vapor deposition (PVD) or the like.

In some embodiments, the metal adhesion layer 46 may be formed having a thickness T2 that is between about 20 Å and about 40 Å. The thickness T2 may be less than, about the same as, or greater than the thickness T1 of the etch stop layer 32. In some embodiments, a directional deposition process like some PVD processes may form a metal adhesion layer 46 having a greater thickness on lateral surfaces than on sidewalls, as shown in FIG. 4. For example, the metal adhesion layer 46 may be formed having a thickness T2 on lateral surfaces (e.g., on the conductive filling material 28) and a thickness T3 on sidewalls that is about the same as or less than the thickness T2. In some embodiments, the thickness T3 of the metal adhesion layer 46 on sidewalls may be between about 5 Å and about 15 Å. Other thicknesses or combinations of thicknesses are possible.

Figure 5:
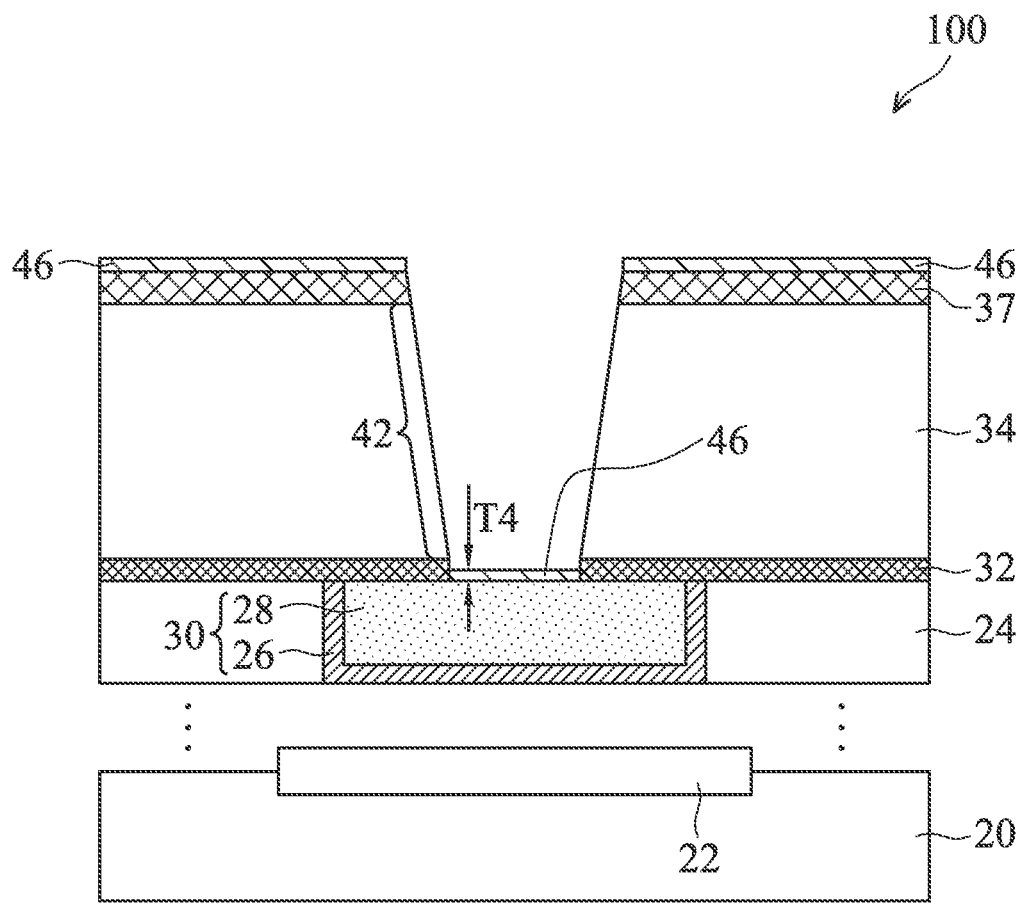

Turning to FIG. 5, an etching process is performed to thin the metal adhesion layer 46. The etching process may reduce the thickness of the metal adhesion layer 46 on the conductive filling material 28. For example, the etching process may reduce the thickness of the metal adhesion layer 46 on the conductive filling material 28 to a thickness T4 that is less than the deposited thickness T2. In some cases, after the etching process, the thickness T4 of the metal adhesion layer 46 on the conductive filling material 28 may be between about 5 Å and about 35 Å, although other thicknesses are possible. The thickness T4 may be less than, about the same as, or greater than the thickness T1 of the etch stop layer 32. For example, FIG. 5 shows an embodiment in which the thickness of the metal adhesion layer 46 is less than the thickness of the etch stop layer 32, but FIGS. 17A-C shows embodiments in which some or all of the metal adhesion layer 46 has a thickness greater than the thickness of the etch stop layer 32. After the etching process, the metal adhesion layer 46 on the conductive filling material 28 may have a flat surface, a convex surface, a concave surface, or an irregular surface, described in greater detail below for FIGS. 17A-C. In some embodiments in which the metal adhesion layer 46 is deposited to a smaller thickness on sidewalls than on lateral surfaces, the etching process may remove the metal adhesion layer 46 from sidewalls of the via opening 42, as shown in FIG. 5.

The etching process to thin the metal adhesion layer 46 may include a suitable wet etching process or a suitable dry etching process. For example, the etching process may be an isotropic wet etching process including $H_2O$, $HNO_3$, HCl, $H_2O_2$, the like, or a combination thereof. The wet etching process may also include other substances such as ethylenediamine tetra-acetic acid (EDTA), ethylene glycol tetra-acetic acid (EGTA), the like, or a combination thereof. For example, a wet etching process that may be used to thin a metal adhesion layer 46 of cobalt may include a mixture of $H_2O$, $HNO_3$, and EDTA. In some embodiments, the wet etching process includes a mixture of $HNO_3$ at about 0.1 M and EDTA at between about 0.01 M and about 0.05 M, but other concentrations or mixtures are possible. The wet etching process may be performed at a temperature of between about 25° C. and about 40° C., and for a duration of time between about 10 seconds and about 60 seconds. These and other variations of an etching process are considered within the scope of this disclosure.

Figure 6:
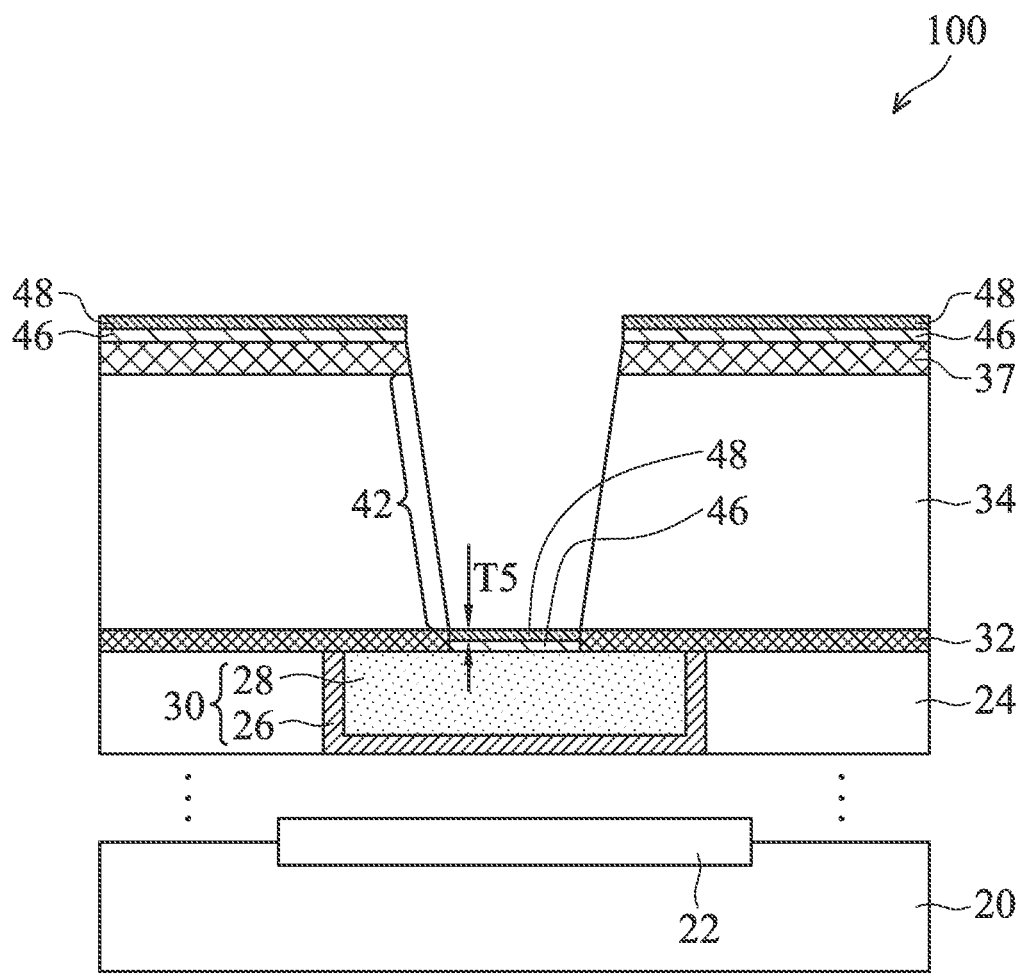

Turning to FIG. 6, a sacrificial layer 48 is then formed on the metal adhesion layer 46, in accordance with some embodiments. As shown in FIG. 6, the sacrificial layer 48 may be deposited such that little or no material of the sacrificial layer 48 is formed on exposed surfaces of the dielectric layer 34, described in greater detail below. The sacrificial layer 48 may be formed to block, prevent, or otherwise inhibit the subsequent formation of the barrier layer 50 (see FIG. 7) on the metal adhesion layer 46. In particular, the sacrificial layer 48 may block the barrier layer 50 from forming on the metal adhesion layer 46 over the conductive filling material 28. By blocking formation of the barrier layer 50, the resistance between the conductive filling material 28 and the subsequently deposited conductive material 56 (see FIG. 9) may be reduced. In some embodiments, the sacrificial layer 48 may extend across the via opening 42 to completely cover the metal adhesion layer 46. In some embodiments, the sacrificial layer 48 is formed having a thickness T5 that is between about 0.5 nm and about 3 nm. The top surface of the sacrificial layer 48 may be above, below, or about level with the etch stop layer 32. In some cases, the sacrificial layer 48 may be formed on sidewall surfaces of the etch stop layer 32 within the via opening 42, as shown in FIG. 6.

In accordance with some embodiments, the sacrificial layer 48 comprises a material that adheres or bonds to the metal adhesion layer 46 and does not adhere or bond to the dielectric layer 34 and/or to the etch stop layer 32. For example, the material may form chelation bonds with metal (e.g., cobalt) of the metal adhesion layer 46 but not form bonds with the dielectric layer 34. In this manner, the subsequently formed barrier layer 50 (see FIG. 7) may be formed on the dielectric layer 34 but be blocked from forming on the conductive filling material 28. Additionally, the sacrificial layer 48 may be a material to which the subsequently formed barrier layer 50 is unlikely or unable to adhere or bond. For example, the chemical structure of the material may be hydrophobic and/or include non-polar groups to which precursors of the barrier layer 50 are unlikely or unable to bond, or the chemical structure of the material may inhibit adsorption of precursors of the barrier layer 50 due to steric hindrance. The material of the sacrificial layer 48 may be chosen such that one or more precursors of the subsequently formed barrier layer 50 have a high selectivity of adsorption on the dielectric layer 34 over the sacrificial layer 48. For example, the selectivity of adsorption on the dielectric layer 34 versus adsorption on the sacrificial layer 48 may be greater than about 5:1. The selectivity may depend on the various materials and/or formation processes used. In this manner, the sacrificial layer 48 is not covered (or only partially covered) by the barrier layer 50 and thus the sacrificial layer 48 may be more easily removed. The sacrificial layer 48 may be deposited by a suitable technique such as a wet chemical soak or exposure to chemical gas, which may depend on the particular material(s) comprising the sacrificial layer 48.

As a first example, the sacrificial layer 48 may include benzotriazole (BTA), which has the chemical formula $C_6H_4N_3H$. BTA molecules have a first side with three nitrogen atoms that can bond to a metal such as cobalt and a second side which has a hydrophobic benzo ring to which some precursors of the barrier layer 50 are unable to bond. The first side of the BTA molecule can bond to the metal adhesion layer 46 while the second side protrudes and blocks precursors from bonding to the metal adhesion layer 46. In this manner, a sacrificial layer 48 comprising a monolayer of BTA or multiple monolayers of BTA can prevent the barrier layer 50 from forming on the metal adhesion layer 46 or on the sacrificial layer 48. In some embodiments, a sacrificial layer 48 may be formed from BTA by soaking the package component 100 in a wet chemical solution containing BTA. For example, BTA may be part of a solution containing $H_2O$ and/or $H_2O_2$, though solutions having other compositions may be used. The solution may be heated to a temperature between about 25° C. and about 50° C., and the package component 100 may be soaked for a duration of time between about 10 seconds and about 60 seconds. A wet clean process may be performed on the package component 100 after soaking in the solution. A sacrificial layer 48 including BTA may be formed using other solutions, process conditions, or techniques than these. The material and deposition technique described is an example, and the sacrificial layer 48 may be formed from other materials using a wet chemical soak process, such as thiol, phosphate, the like, other materials, or combinations thereof.

As a second example, the sacrificial layer 48 may include 5-Decyne, which has the chemical formula $C_{10}H_{18}$. The 5-Decyne molecules can form bonds to metals such as cobalt and to other 5-Decyne molecules, but 5-Decyne molecules do not bond to the dielectric layer 34. Additionally, precursors of the barrier layer 50 do not form bonds to 5-Decyne molecules. For example, 5-Decyne is hydrophobic with —$CH_3$ groups, and thus 5-Decyne does not bond to the barrier layer 50. In this manner, a sacrificial layer 48 comprising a layer of 5-Decyne molecules can prevent the barrier layer 50 from forming on the metal adhesion layer 46 or on the sacrificial layer 48. In some embodiments, a sacrificial layer 48 may be formed from 5-Decyne by exposing the package component 100 to a gas mixture including 5-Decyne molecules. For example, the 5-Decyne may be part of a gas mixture including carrier gases such as He, Ar, or the like, though other mixtures may be used. The gas mixture may be flowed into the process chamber at a flow rate between about 600 sccm and about 3000 sccm for a time duration between about 10 seconds and about 120 seconds. A process temperature between about 100° C. and about 350° C. may be used, and a process pressure between about 1 Torr and about 30 Torr may be used. A sacrificial layer 48 including 5-Decyne may be formed using other gas mixtures, process conditions, or techniques than these. The material and deposition technique described is an example, and the sacrificial layer 48 may be formed from other materials using a gas deposition process, such as from other alkynes, derivatives of alkenes, BTA in a gaseous phase, the like, hexane in a gaseous phase, the like, or a combination thereof.

Figure 7:
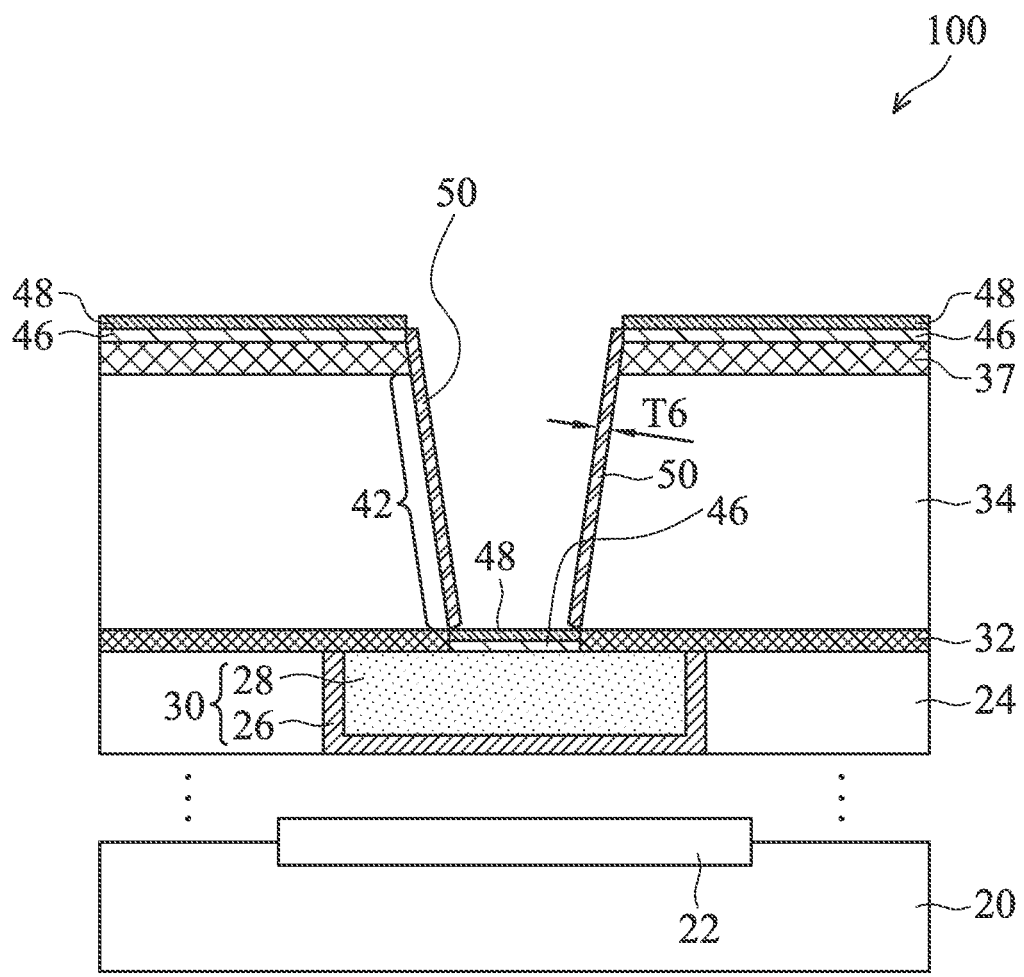

Turning to FIG. 7, a conductive barrier layer 50 is deposited on surfaces within the via opening 42, in accordance with some embodiments. The barrier layer 50 has the function of preventing atoms in the subsequently deposited conductive material 56 (FIG. 9) from diffusing into dielectric layer 34. The barrier layer 50 is formed over exposed surfaces of the dielectric layer 34 and the etch stop layer 32, but is blocked from forming on the metal adhesion layer 46 within the via opening 42 by the sacrificial layer 48. Additionally, the barrier layer 50 does not significantly form on exposed surfaces of the sacrificial layer 48, as described previously. The barrier layer 50 may comprise a barrier material such as titanium, titanium nitride, tantalum, tantalum nitride, the like, or a combination thereof. The barrier layer 50 may be a material similar to the diffusion barrier layer 26, in some embodiments.

In some embodiments, the barrier layer 50 may be deposited using a suitable process, such as an ALD process and/or a CVD process. In some cases, forming the barrier layer 50 using an ALD process or a CVD process may allow for better step coverage and better conformity compared with other processes, such as a PVD process. For example, the barrier layer 50 may comprise TaN deposited using an ALD process. The precursors of TaN may include, for example, Pentakis Dimethylamino Tantalum ("PDMAT") as a first precursor, which has the chemical formula $C_{10}H_{30}N_5Ta$, and ammonia as a second precursor, which has the chemical formula $NH_3$. The barrier layer 50 may include different materials and/or different precursors in other embodiments. In some embodiments, the deposition of the barrier layer 50 may be performed in the same process chamber as the formation of the sacrificial layer 48 and/or the metal adhesion layer 46. In some embodiments, the barrier layer 50 may be formed having a thickness T6 that is between about 10 Å and about 40 Å.

Figure 8:
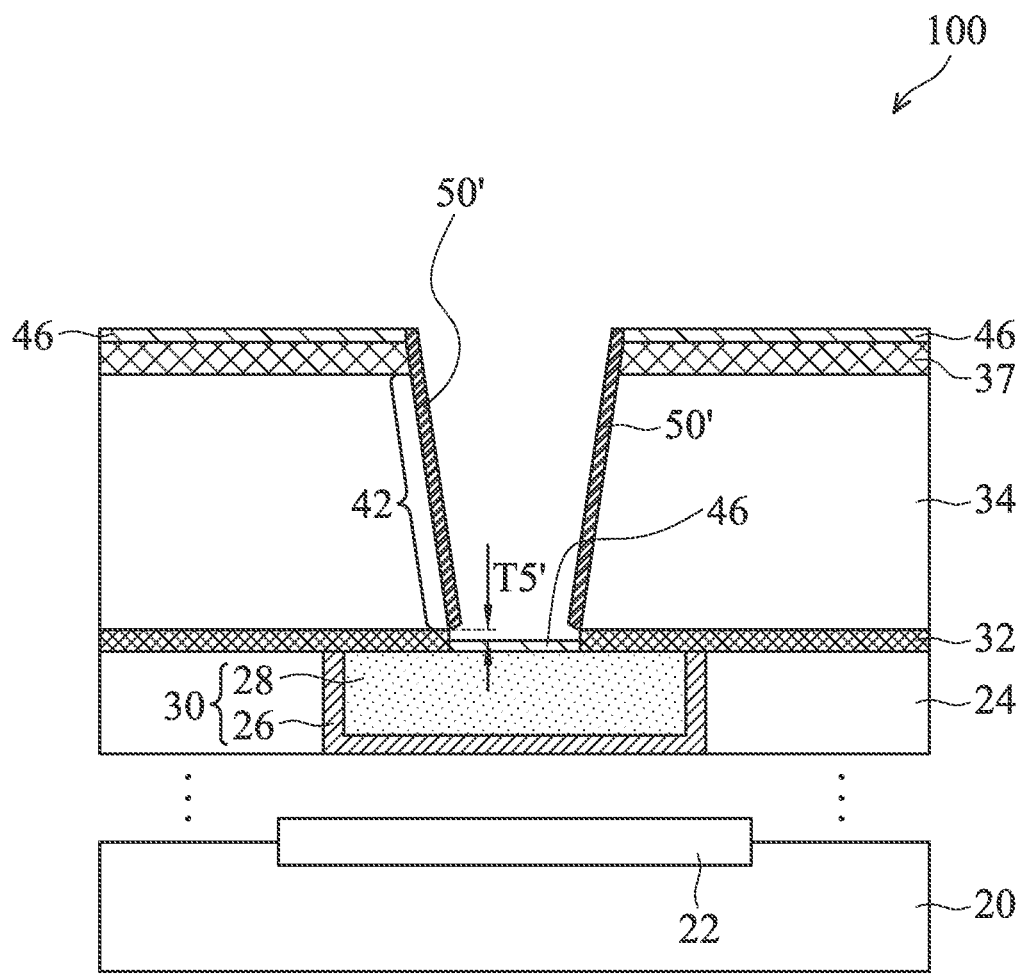

Turning to FIG. 8, the sacrificial layer 48 is removed, in accordance with some embodiments. In some embodiments, the process used to remove the sacrificial layer 48 also densifies the barrier layer 50. The barrier layer 50 after densification is referred to herein as densified barrier layer 50' or barrier layer 50', and is indicated similarly in FIG. 8 and subsequent figures. The removal process may densify the barrier layer 50 into densified barrier layer 50' by, for example, driving nitrogen from the barrier layer 50. A removal process that densifies the barrier layer 50 may include, for example, a thermal treatment or a plasma treatment such as an in-situ $H_2$ or Ar plasma treatment, described in greater detail below. After removing the sacrificial layer 48, the barrier layer 50' may be separated from the metal adhesion layer 46 by a distance T5' that is approximately equal to the thickness T5 of the sacrificial layer 48. For example, the distance T5' may be between about 0.5 nm and about 3 nm, though other distances are possible. As shown in FIG. 8, removing the sacrificial layer 48 may expose sidewalls of the etch stop layer 32 that were previously covered by the sacrificial layer 48.

In some embodiments, a removal process that removes the sacrificial layer 48 includes a thermal treatment such as an anneal process. For example, the anneal process may include annealing the package component 100 in an anneal chamber at a temperature between about 250° C. and about 400° C. for a duration of time between about 30 seconds and about 300 seconds. The package component 100 may be exposed to one or more gases during the anneal process, such as an inert gas (e.g., He, Ar, or the like), a reducing gas (e.g., $H_2$ or the like), or a combination thereof. The gas(es) may be flowed into the anneal chamber at a flow rate between about 600 sccm and about 3000 sccm. During the anneal process, the anneal chamber may have a pressure between about 1 Torr and about 30 Torr. A removal process including an anneal process may have other annealing parameters than these. In some embodiments, the anneal chamber is the same chamber as the process chamber used for depositing the barrier layer 50.

In some embodiments, the removal process includes a plasma treatment. For example, the plasma treatment may include exposing the package component 100 to a plasma of one or more process gases such as $H_2$, $NH_3$, Ar, the like, or combinations thereof. The process gas(es) may be flowed at a flow rate between about 600 sccm and about 3000 sccm. The plasma treatment may be performed at a pressure between about 0.1 Torr and about 5 Torr. In some embodiments, the plasma is generated using an RF power between about 100 Watts and about 600 Watts. The plasma treatment may be performed at a temperature between about 25° C. and about 400° C., and may be performed for a duration of time between about 10 seconds and about 30 seconds. A removal process including a plasma treatment may have other parameters than these. In some embodiments, the plasma treatment is performed using the same process chamber used for depositing the barrier layer 50. In some embodiments, one of an anneal process or a plasma treatment is performed. In other embodiments both an anneal process and a plasma treatment are performed, which may be performed in either order.

In some cases, a removal process including an thermal treatment and/or a plasma treatment as described above may reduce the concentration of nitrogen within the barrier layer 50, forming a densified barrier layer 50'. A densified barrier layer 50' may be more effective at blocking diffusion into the dielectric layer 34 and thus may improve device performance. In some cases, the removal process may also reduce the resistivity of the barrier layer 50, which can further improve device performance. While the figures illustrate embodiments including a densified barrier layer 50', in other embodiments a removal process may be performed that does not densify the barrier layer 50.

Figure 9:
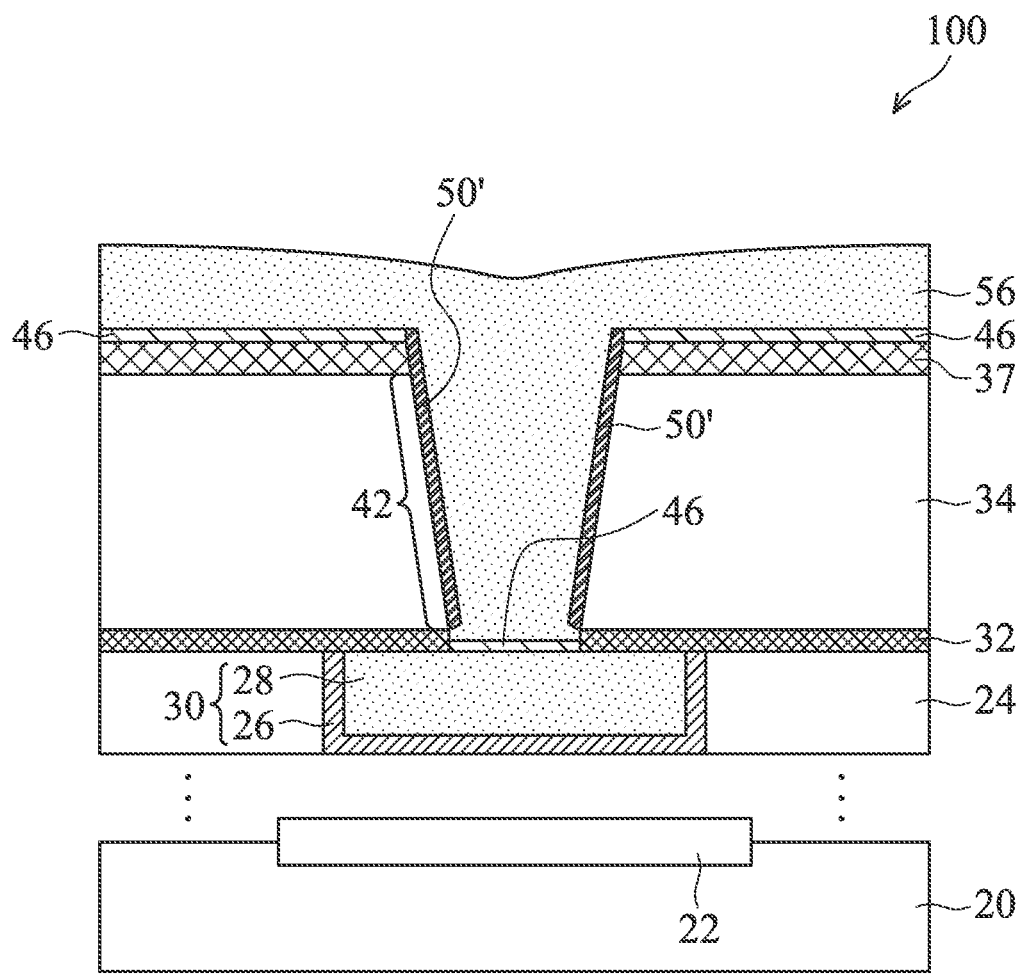

Turning to FIG. 9, a conductive material 56 is deposited to fill the via opening 42, in accordance with some embodiments. The conductive material 56 may be deposited, for example, by performing a blanket deposition to form a metal seed layer (e.g., a copper layer) using a PVD process, and then filling the rest of via opening 42 using, for example, electro-plating, electro-less plating, deposition, or the like. The conductive material 56 may include copper, a copper alloy, cobalt, tungsten, ruthenium, the like, other metals, or combinations thereof. The conductive material 56 may be the same material as the conductive filling material 28 or may be a different material.

By blocking the barrier layer 50 from forming over the conductive filling material 28 (see FIG. 7), a "barrier-free" interface between the conductive material 56 and the conductive filling material 28 is formed. In some cases, the contact resistance (Rc) of this barrier-free interface is smaller than if the barrier layer 50 was present between the conductive material 56 and the conductive filling material 28. In some cases, the use of the metal adhesion layer 46 without an overlying barrier layer 50 may reduce the contact resistance between about 20% and about 40%. Additionally, by forming the metal adhesion layer 46 on the conductive filling material 28, the thermal stability of the interface between the conductive material 56 and the conductive filling material 28 may be improved. In this manner, the techniques described herein may allow for improved contact resistance between a via 58 and a conductive feature (e.g., conductive feature 30). As shown in FIG. 9, due to the separation between the barrier layer 50' and the metal adhesion layer 46, the conductive material 56 may contact sidewalls of the etch stop layer 32 that are not covered by the barrier layer 50'. In this manner, portions of the conductive material 56 may extend between the barrier layer 50' and the metal adhesion layer 46, and the interface between the conductive material 56 and the conductive filling material 28 may be formed having a greater lateral width. In some cases, increasing the lateral width of the interface can decrease the resistance of the interface.

Figure 10:
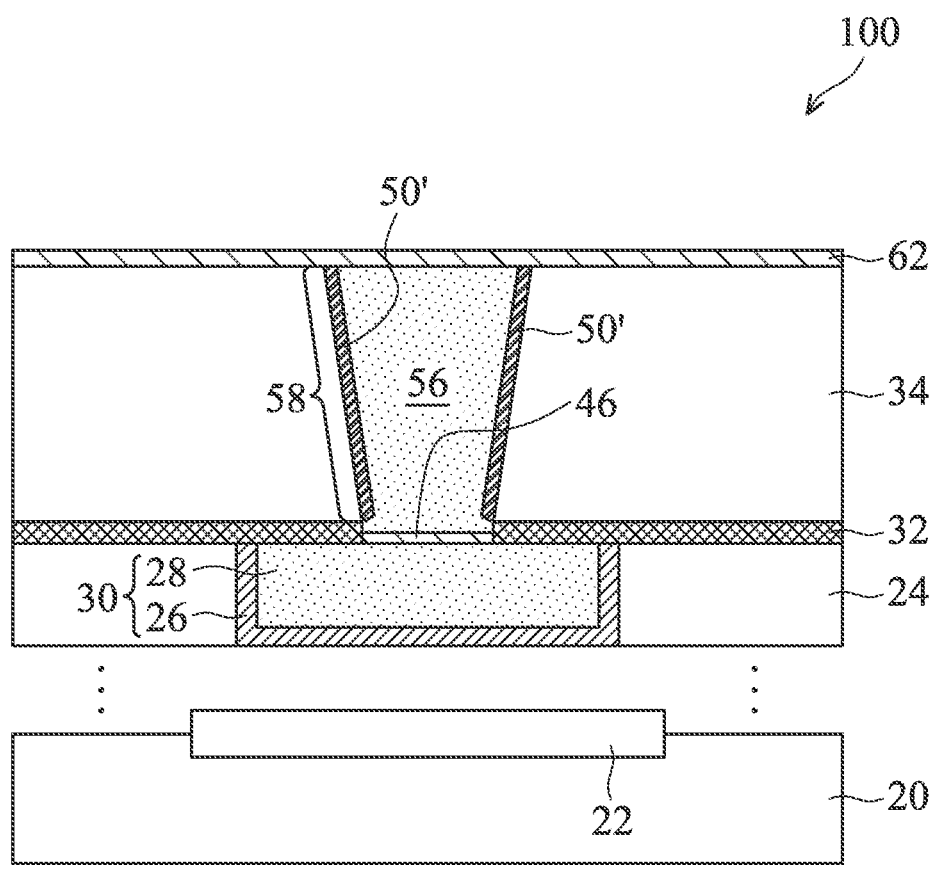

Turning to FIG. 10, a planarization process such as a Chemical Mechanical Planarization (CMP) process, a mechanical polish process, and/or a grinding process may be performed to remove excess portions of conductive material 56, hence forming the via 58, in accordance with some embodiments. The via 58 includes remaining portions of the barrier layer 50' and the conductive material 56. FIG. 10 also illustrates the formation of an optional dielectric etch stop layer 62, which covers and contacts the dielectric layer 34 and the via 58. In accordance with some embodiments, the dielectric etch stop layer 62 is formed of one or more layers of metal oxide, metal nitride, metal carbonitride, silicon nitride, the like, or combinations thereof. In this manner, a via 58 may be formed over a conductive feature 30 using a metal adhesion layer 46.

Figure 11:
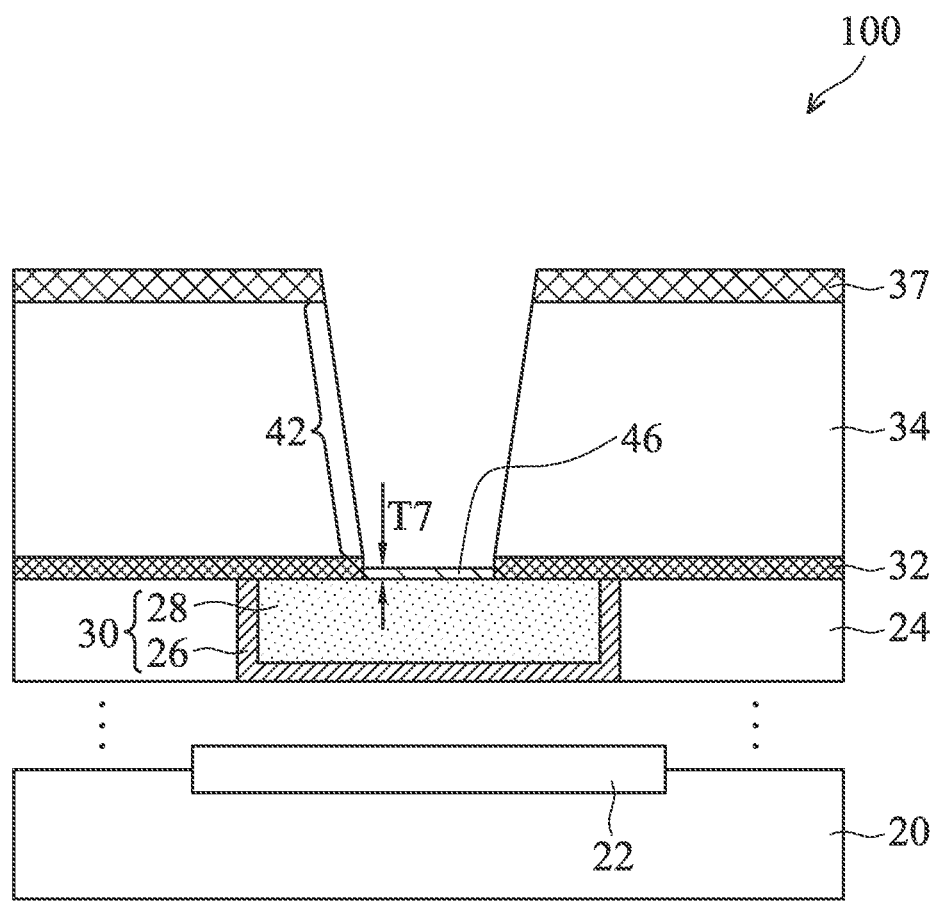
FIGS. 11 through 16 illustrate the cross-sectional views of intermediate stages in the formation of a via, in accordance with some embodiments.

FIGS. 11 through 16 illustrate a second process for forming a via 58 with a metal adhesion layer 46 (see FIG. 16), in accordance with some embodiments. The process shown in FIGS. 11 through 16 is similar to the first process shown in FIGS. 1 through 10, except that the metal adhesion layer 46 is formed using a selective deposition process that forms the material of the metal adhesion layer 46 on surfaces of the conductive filling material 28 over surfaces of the dielectric layer 34. FIG. 11 follows from the structure shown in FIG. 3, in which the conductive filling material 28 is exposed. The process described in FIGS. 11-16 may be repeated to form additional layers of metallization, such as for forming an interconnect structure or the like.

FIG. 11 illustrates the deposition of the metal adhesion layer 46, in accordance with some embodiments. The metal adhesion layer 46 may be a similar material as those described previously for FIG. 4. In the embodiment shown in FIG. 11, the metal adhesion layer 46 is deposited using a selective deposition process such that the material of the metal adhesion layer 46 is formed on the conductive filling material 28 and little or no material of the metal adhesion layer 46 is formed on the dielectric layer 34. For example, the selectivity of deposition on the conductive filling material 28 versus the dielectric layer 34 may be greater than about 100:1, though other selectivities are possible. In some cases, the material of the metal adhesion layer 46 may also be formed on the metal hard mask 37 (if present).

In some embodiments, the metal adhesion layer 46 may be deposited on the conductive filling material 28 to a thickness T7 that is between about 10 Å and about 40 Å, although other thicknesses are possible. The thickness T7 may be less than, about the same as, or greater than the thickness T1 of the etch stop layer 32. For example, FIG. 11 shows an embodiment in which the thickness of the metal adhesion layer 46 is less than the thickness of the etch stop layer 32, but FIGS. 17A-C shows embodiments in which some or all of the metal adhesion layer 46 has a thickness greater than the thickness of the etch stop layer 32. The metal adhesion layer 46 on the conductive filling material 28 may have a flat surface, a convex surface, a concave surface, or an irregular surface, described in greater detail below for FIGS. 17A-C.

To selectively deposit the metal adhesion layer 46, a suitable deposition process may be used, such as ALD, PVD, CVD, or the like. The particular deposition process used and/or precursors used may depend on the specific materials of the metal adhesion layer 46, the conductive filling material 28, and/or the dielectric layer 34. As an example of selectively depositing the metal adhesion layer 46 on the conductive filling material 28, a CVD process may be used to selectively deposit a metal adhesion layer 46 of cobalt. The cobalt may be deposited by a CVD process using cyclopentadienylcobalt dicarbonyl ($CpCo(CO)_2$) and another gas such as $H_2$ or a mixture of $H_2$ and $NH_3$. A process temperature between about 150° C. and about 250° C. may be used, and a process pressure between about 10 Torr and about 30 Torr may be used. In some cases, cobalt deposited in this manner may deposit on the dielectric layer 34 to a thickness that is less than 1% of the thickness of the cobalt that is deposited on the conductive filling material 28. As another example, a metal adhesion layer 46 of ruthenium may be selectively deposited using "CHORuS" ($Ru(C_7H_{10})(CO)_3$) or triruthium dodecycarbonyl ($Ru_3(CO)_{12}$). In some embodiments, a surface treatment may be performed on the conductive filling material 28 prior to deposition of the metal adhesion layer 46. The surface treatment may, for example, remove oxidation or otherwise clean the surface of the conductive filling material 28, and may include a wet chemical treatment and/or a plasma treatment, such as exposing the surface of the conductive filling material 28 to a hydrogen plasma or the like. These are examples, and other materials, precursors, gases, and/or process parameters may be used in other embodiments.

Figure 12:
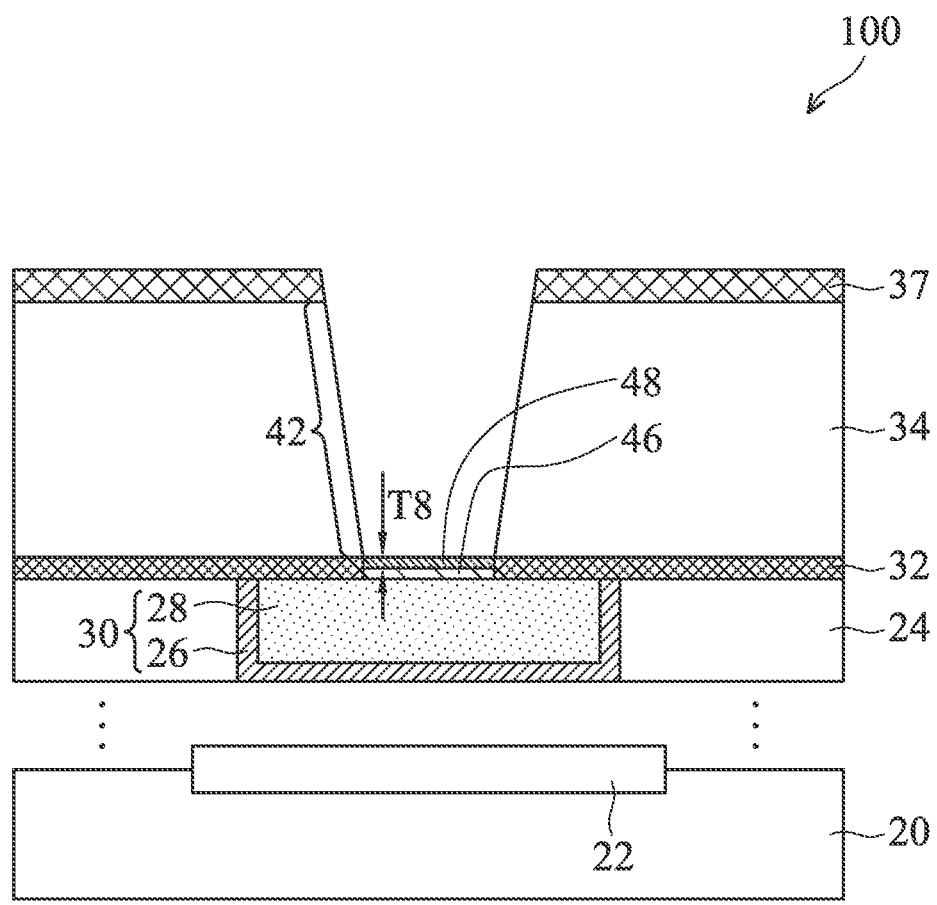

Turning to FIG. 12, a sacrificial layer 48 is then formed on the metal adhesion layer 46, in accordance with some embodiments. The sacrificial layer 48 may be similar to the sacrificial layer 48 described for FIG. 6, and may be formed in a similar manner. For example, the sacrificial layer 48 may be selectively deposited on the metal adhesion layer 46. The sacrificial layer 48 may be formed to block, prevent, or otherwise inhibit the subsequent formation of the barrier layer 50 (see FIG. 13) on the metal adhesion layer 46. In some embodiments, the sacrificial layer 48 is formed having a thickness T8 that is between about 0.5 nm and about 3 nm. The top surface of the sacrificial layer 48 may be above, below, or about level with the etch stop layer 32. In some cases, the sacrificial layer 48 may be formed on sidewall surfaces of the etch stop layer 32 within the via opening 42, as shown in FIG. 12.

Figure 13:
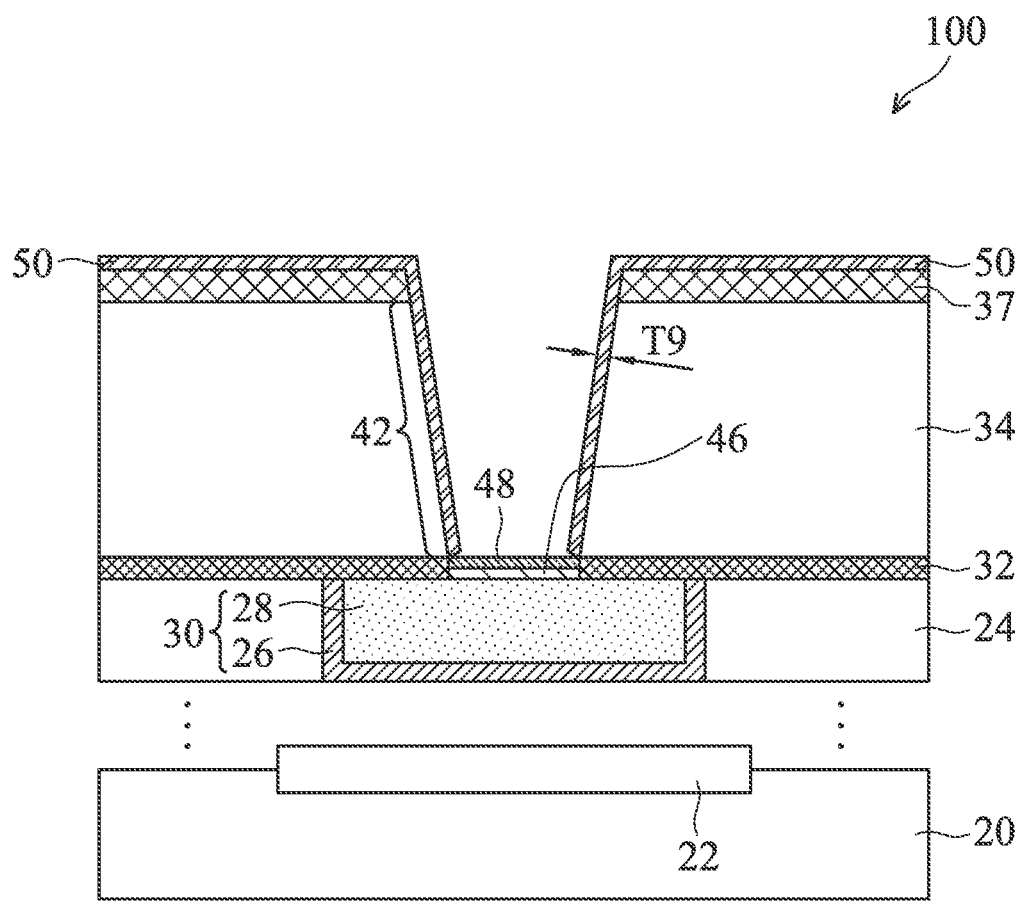

Turning to FIG. 13, a conductive barrier layer 50 is deposited on surfaces within the via opening 42, in accordance with some embodiments. The barrier layer 50 may be similar to the barrier layer 50 described for FIG. 7, and may be formed in a similar manner. The barrier layer 50 is formed over exposed surfaces of the dielectric layer 34 and the etch stop layer 32, but is blocked from forming on the metal adhesion layer 46 within the via opening 42 by the sacrificial layer 48. Additionally, the barrier layer 50 does not significantly form on exposed surfaces of the sacrificial layer 48, as described previously. The barrier layer 50 may also be formed over the metal hard mask 37 (if present), as shown in FIG. 13. In some embodiments, the deposition of the barrier layer 50 may be performed in the same process chamber as the formation of the sacrificial layer 48 and/or the metal adhesion layer 46. In some embodiments, the barrier layer 50 may be formed having a thickness T9 that is between about 10 Å and about 40 Å.

Figure 14:
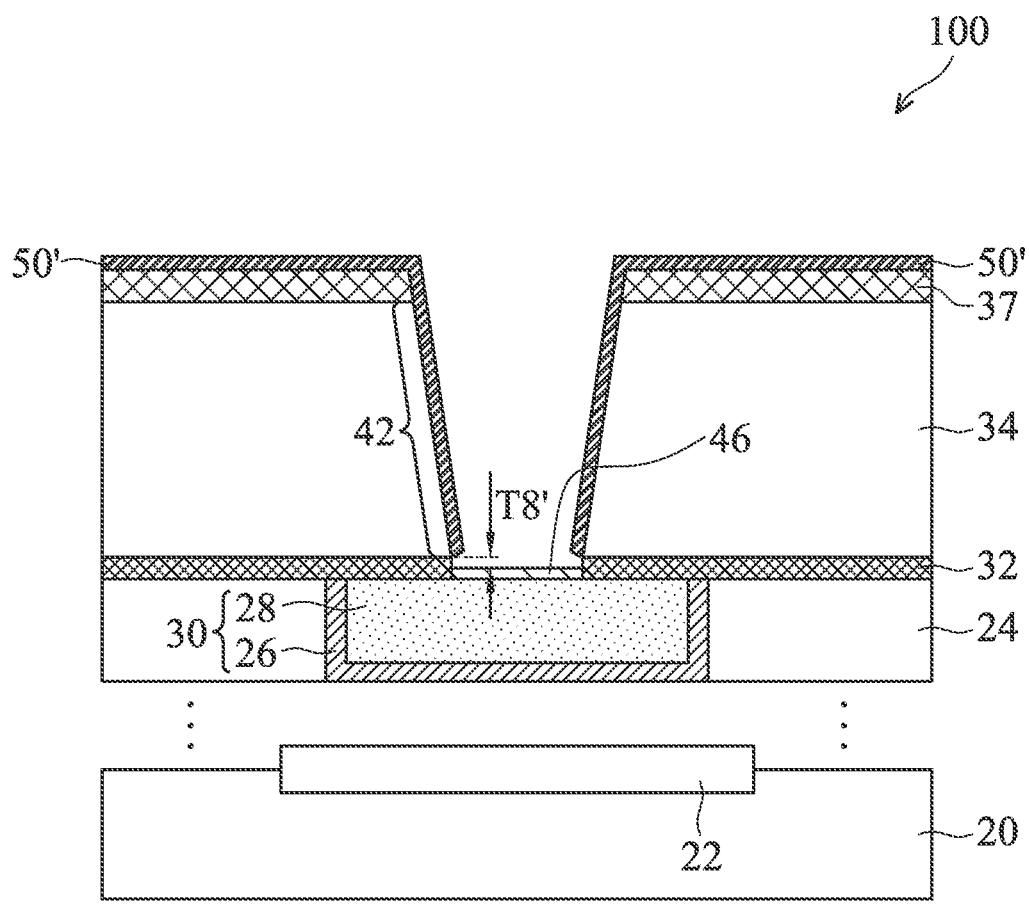

Turning to FIG. 14, the sacrificial layer 48 is removed, in accordance with some embodiments. The sacrificial layer 48 may be removed using a technique similar to those described previously for FIG. 8. The removal process may densify the barrier layer 50 into densified barrier layer 50' by, for example, driving nitrogen from the barrier layer 50 using a thermal treatment or a plasma treatment similar to that described previously. In other embodiments, the removal process does not densify the barrier layer 50. After removing the sacrificial layer 48, the barrier layer 50' may be separated from the metal adhesion layer 46 by a distance T8' that is approximately equal to the thickness T8 of the sacrificial layer 48. For example, the distance T8' may be between about 0.5 nm and about 3 nm, though other distances are possible. As shown in FIG. 8, removing the sacrificial layer 48 may expose sidewalls of the etch stop layer 32 that were previously covered by the sacrificial layer 48.

Figure 15:
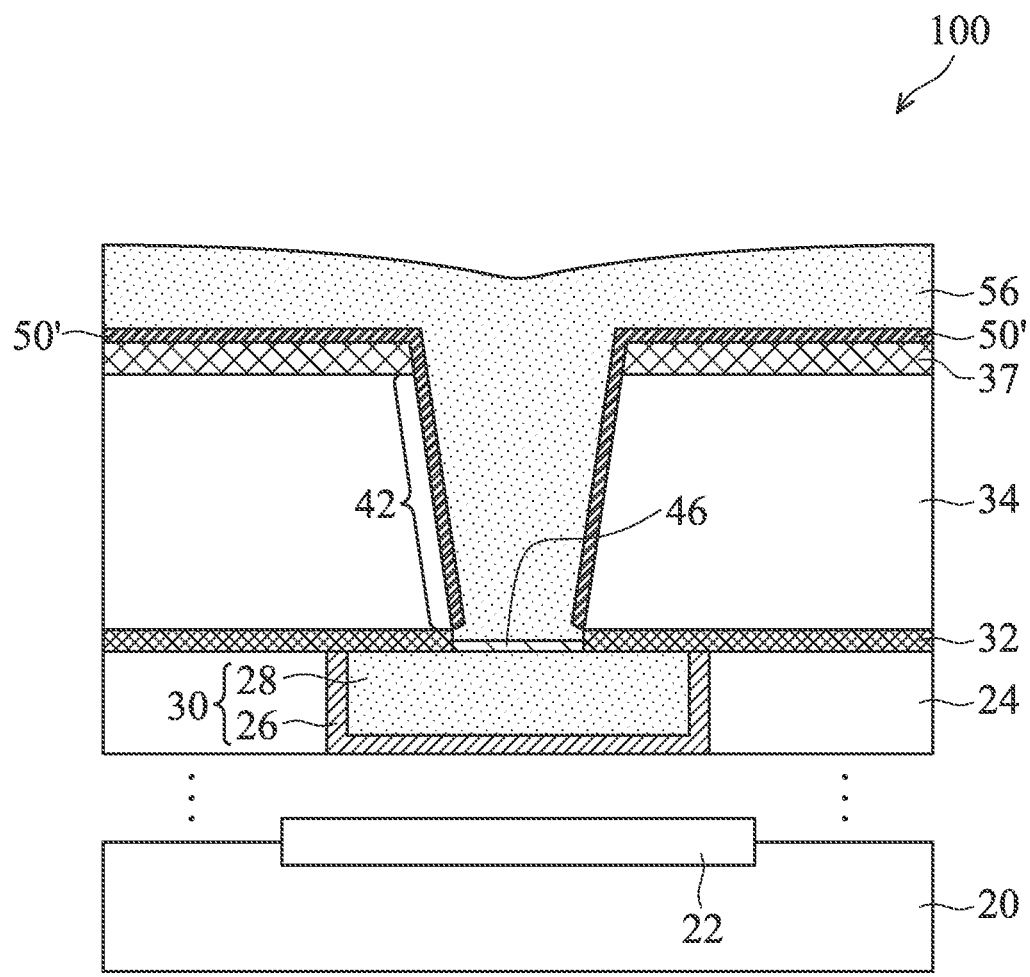
Figure 16:
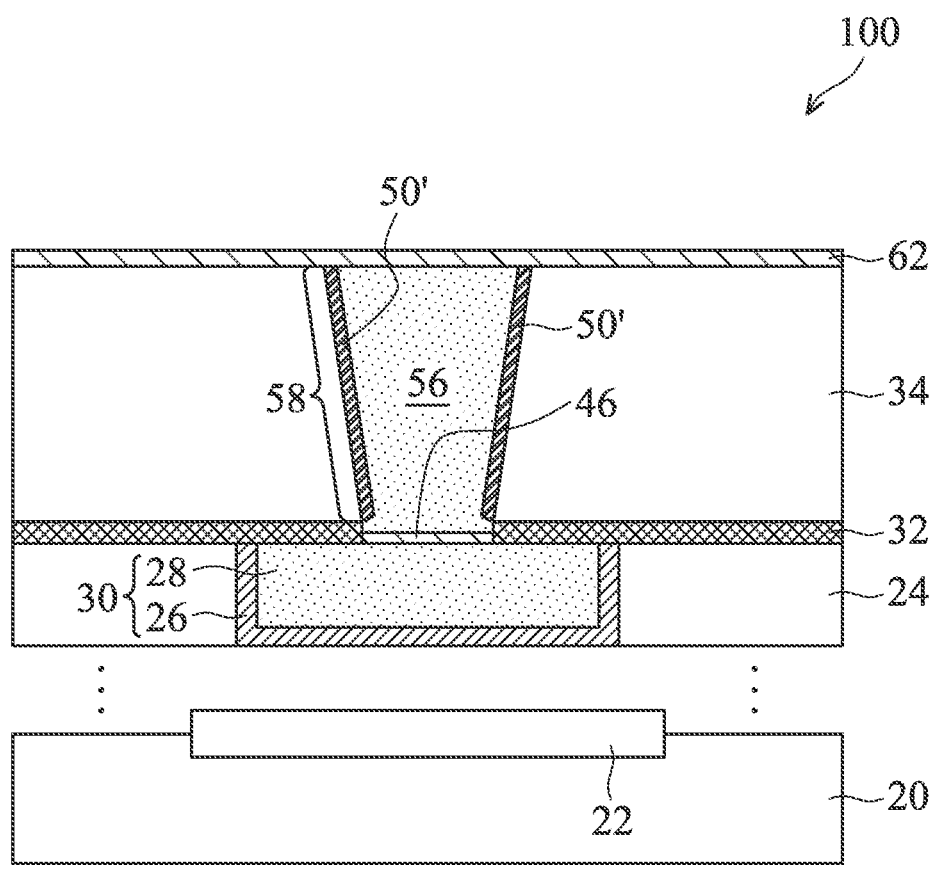

Turning to FIG. 15, a conductive material 56 is deposited to fill the via opening 42, in accordance with some embodiments. The conductive material 56 may be similar to the conductive material 56 described for FIG. 9, and may be formed in a similar manner. In FIG. 16, a planarization process may be performed to remove excess portions of conductive material 56, hence forming the via 58, in accordance with some embodiments. FIG. 16 also illustrates the formation of an optional dielectric etch stop layer 62, which may be similar to the dielectric etch stop layer 62 described for FIG. 10. In this manner, a via 58 may be formed over a conductive feature 30 using a metal adhesion layer 46 formed by a selective deposition process.

Turning to FIGS. 17A-C, metal adhesion layers 46 having different top surfaces are shown, in accordance with some embodiments. FIGS. 17A-C illustrate magnified portions of cross-sections similar to the cross-sections shown previously (e.g., FIG. 10 or FIG. 16). Some or all of the metal adhesion layers 46 shown in FIGS. 17A-C have a thickness greater than the thickness T1 of the etch stop layer 32, but in other embodiments some or all of a metal adhesion layer 46 may have a thickness about the same as or less than the thickness T1 of the etch stop layer 32. FIG. 17A illustrates an embodiment in which the metal adhesion layer 46 has a substantially flat top surface. A metal adhesion layer 46 with a flat surface may be formed, for example, by conformal deposition followed by thinning (e.g., as described for FIGS. 4-5) or by selective deposition (e.g., as described for FIG. 11). FIG. 17B illustrates an embodiment in which the metal adhesion layer 46 has a substantially convex top surface. A metal adhesion layer 46 with a convex surface may be formed, for example, by selective deposition (e.g., as described for FIG. 11). In some cases, the convex shape may be formed due to the smaller deposition rate of the material of the metal adhesion layer 46 on the dielectric layer 34. FIG. 17C illustrates an embodiment in which the metal adhesion layer 46 has a substantially concave top surface. A metal adhesion layer 46 with a concave surface may be formed, for example, by conformal deposition followed by thinning (e.g., as described for FIGS. 4-5). In some cases, the concave shape may be formed due to the etching process that thins the metal adhesion layer 46 removing less material near surfaces of the dielectric layer 34. (e.g., near the sidewalls of the via opening 42.) In some cases, a metal adhesion layer 46 with a concave surface may have a smaller electrical resistance than a metal adhesion layer 46 with a convex surface. The shapes of the metal adhesion layer 46 shown in FIGS. 17A-C are examples, and a metal adhesion layer 46 may be formed having a differently shaped top surface, such as an irregular shape or a combination of flat, convex, or concave surfaces.

Figure 18:
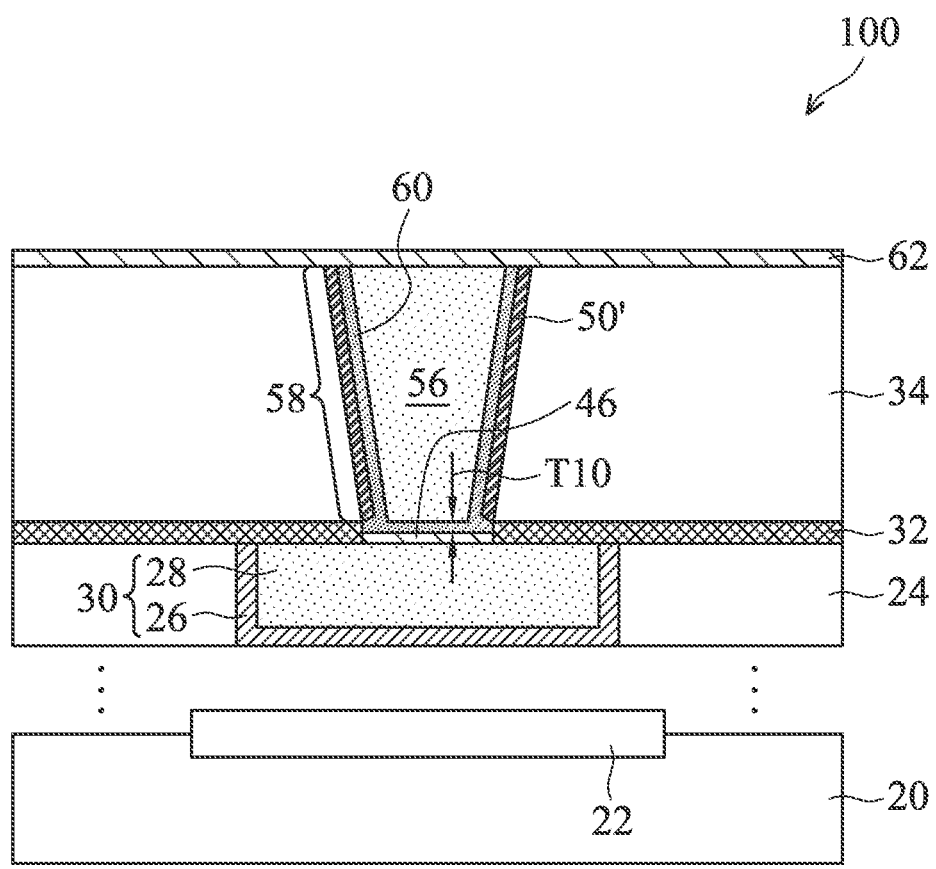

FIG. 18 illustrates an embodiment in which an additional metal adhesion layer 60 is deposited before the deposition of the conductive material 56. The additional metal adhesion layer 60 may be a material such as cobalt, ruthenium, the like, or combinations thereof. The additional metal adhesion layer 60 may be the same material or a different material than the underlying metal adhesion layer 46. The additional metal adhesion layer 60 may be formed using a suitable deposition process such as PVD, CVD, ALD, or the like, including the techniques described above for deposition the metal adhesion layer 46. In some embodiments, the additional metal adhesion layer 60 may be formed having a thickness T10 that is between about 10 Å and about 40 Å. In some cases, depositing an additional metal adhesion layer 60 may improve the adhesion and thermal stability of the interface between the conductive material 56 and the barrier layer 50'.

Figure 19:
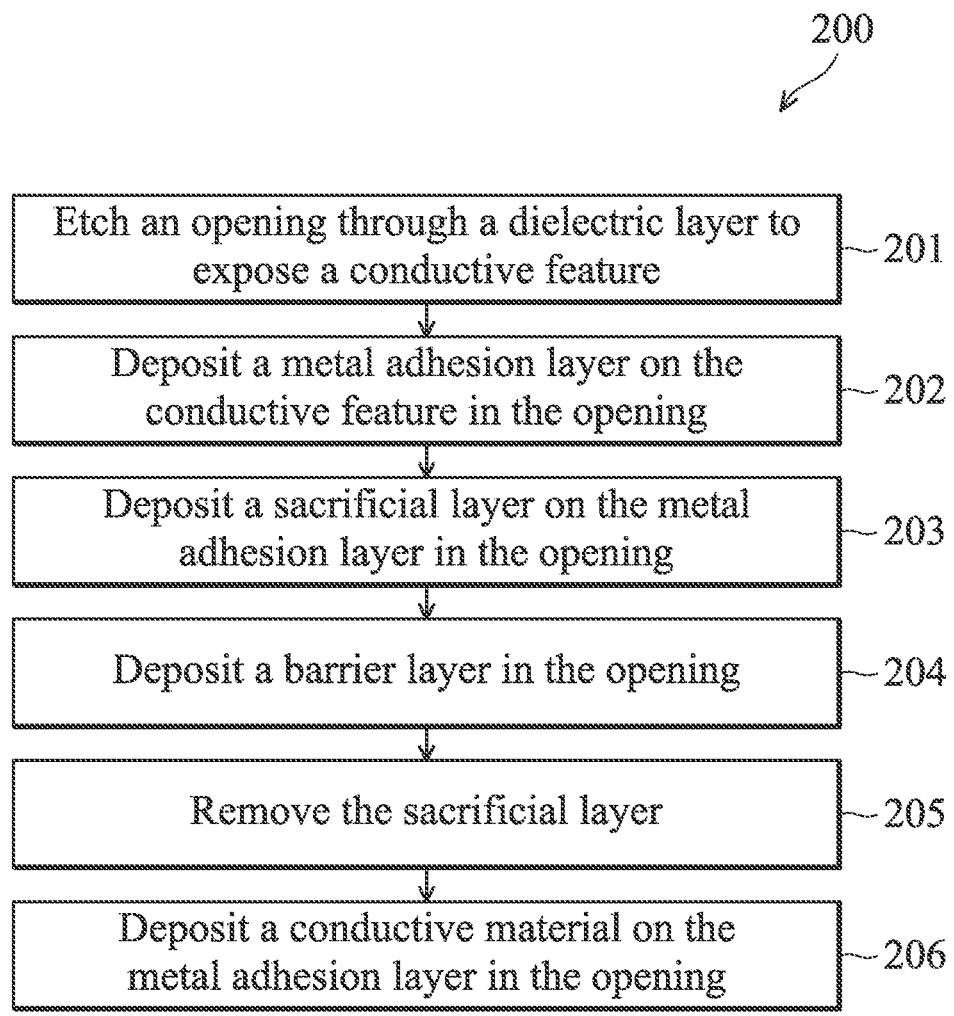
FIG. 19 illustrates a flowchart for a method of forming a via, in accordance with some embodiments.

FIG. 19 illustrates a flowchart for a method 200 of forming a via, in accordance with some embodiments. It should be understood that the embodiment method shown in FIG. 19 is merely an example of many possible embodiment methods. One of ordinary skill in the art would recognize many variations, alternatives, and modifications. For example, various steps as illustrated in FIG. 19 may be added, removed, replaced, rearranged and repeated.

Referring to FIG. 19, at step 201, an opening is etched through a dielectric layer to expose a conductive feature. This is shown, for example, in FIG. 3. At step 202, a metal adhesion layer is deposited on the conductive feature in the opening. This is shown, for example, in FIG. 4 in which a metal adhesion layer is conformally deposited or in FIG. 11 in which a metal adhesion layer is selectively deposited. At step 203, a sacrificial layer is deposited on the metal adhesion layer in the opening. This is shown, for example, in FIG. 6 or FIG. 12. At step 204, a barrier layer is deposited in the opening. This is shown, for example, in FIG. 7 or FIG. 13. At step 205, the sacrificial layer is removed. This is shown, for example, in FIG. 8 or FIG. 14. In some embodiments, removing the sacrificial layer also densifies the barrier layer. At step 206, a conductive material is deposited on the metal adhesion layer in the opening, forming the via. This is shown, for example, in FIG. 10 or FIG. 16.

The embodiments of the present disclosure have some advantageous features. By using a sacrificial layer to block formation of the barrier layer on a conductive feature, the contact resistance of the interface between the conductive feature and an overlying conductive material may be reduced, which can improve device performance. Additionally, the formation of a metal adhesion layer between the conductive feature and the overlying conductive material can improve the thermal stability of the interface, which can reduce time-dependent dielectric breakdown (TDDB) of the device and improve yield. The metal adhesion layer can be formed using different processes, such as by a conformal deposition process followed by a thinning process or by a selective deposition process that selectively deposits the metal adhesion layer on the conductive feature. The techniques described herein may be used to form a variety of conductive features, such as metal lines, vias, interconnects, Back End of Line (BEOL) features, or the like.

In accordance with some embodiments of the present disclosure, a structure includes a first conductive feature in a first dielectric layer; a second dielectric layer over the first dielectric layer; and a second conductive feature extending through the second dielectric layer to physically contact the first conductive feature, wherein the second conductive feature includes a metal adhesion layer over and physically contacting the first conductive feature; a barrier layer extending along sidewalls of the second dielectric layer; and a conductive filling material extending over the metal adhesion layer and the barrier layer, wherein a portion of the conductive filling material extends between the barrier layer and the metal adhesion layer. In an embodiment, the structure includes an etch stop layer between the first dielectric layer and the second dielectric layer, wherein the second conductive feature extends through the etch stop layer. In an embodiment, a thickness of the metal adhesion layer is less than a thickness of the etch stop layer. In an embodiment, the etch stop layer is free of the barrier layer. In an embodiment, the barrier layer includes tantalum nitride (TaN). In an embodiment, a top surface of the metal adhesion layer is concave. In an embodiment, a top surface of the metal adhesion layer is convex. In an embodiment, the portion of the conductive filling material extending between the barrier layer and the metal adhesion layer has a thickness between 0.5 nm and about 3 nm.

In accordance with some embodiments of the present disclosure, an integrated circuit structure includes a first inter-metal dielectric layer (IMD) over a substrate; a metal line in the first IMD; a second IMD over the first IMD; and a via in the second IMD, wherein the via physically contacts the metal line, wherein the via includes a filling material including a first conductive material; a first adhesion layer extending between the filling material and the metal line, wherein the first adhesion layer includes a second conductive material; and a diffusion barrier layer extending between the filling material and the second IMD, wherein the first adhesion layer is free of the diffusion barrier layer, wherein the diffusion barrier layer includes a third conductive material. In an embodiment, the first conductive material is copper and the second conductive material is cobalt. In an embodiment, the first adhesion layer has a thickness between 5 Å and 35 Å. In an embodiment, the integrated circuit structure includes an etch stop layer extending over the metal line, wherein the via extends through the etch stop layer. In an embodiment, a sidewall of the etch stop layer is covered by the first adhesion layer. In an embodiment, the filling material physically contacts a sidewall of the etch stop layer. In an embodiment, the integrated circuit structure includes a second adhesion layer extending over the diffusion barrier layer and the first adhesion layer. In an embodiment, the second adhesion layer includes the second conductive material.

In accordance with some embodiments of the present disclosure, a method of forming a semiconductor device includes forming a conductive feature in a first dielectric layer; forming a second dielectric layer over the first dielectric layer; etching an opening through the second dielectric layer, the etching exposing a surface of the conductive feature; depositing a metal adhesion layer in the opening, wherein the metal adhesion layer covers the exposed surface of the conductive feature; depositing a sacrificial layer in the opening, wherein the sacrificial layer selectively forms on the metal adhesion layer over surfaces of the second dielectric layer; depositing a barrier layer in the opening, wherein the barrier layer selectively forms on surfaces of the second dielectric layer over the sacrificial layer; removing the sacrificial layer; and depositing a conductive material to fill the opening, wherein the conductive material covers the metal adhesion layer. In an embodiment, the sacrificial layer includes benzotriazole (BTA). In an embodiment, depositing the metal adhesion layer includes a chemical vapor deposition (CVD) process that selectively forms the metal adhesion layer on the conductive feature over the second dielectric layer. In an embodiment, depositing the metal adhesion layer includes conformally depositing the metal adhesion layer within the opening and, after depositing the metal adhesion layer, performing an etching process to thin the metal adhesion layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming an insulating layer over a conductive feature;
   forming a metal mask over the insulating layer;
   etching the insulating layer using the metal mask to form an opening that exposes a surface of the conductive feature;
   selectively depositing an adhesion layer on the exposed surface of the conductive feature;
   selectively depositing a sacrificial layer on the adhesion layer;
   selectively depositing a barrier layer on surfaces of the insulating layer and the metal mask;
   performing a removal process to remove the sacrificial layer, wherein the removal process densifies the barrier layer; and
   depositing a conductive fill material in the opening.

2. The method of claim 1, wherein the adhesion layer comprises cobalt.

3. The method of claim 1, wherein the removal process comprises an anneal.

4. The method of claim 1 further comprising performing a planarization process after depositing the conductive fill material, wherein the planarization process removes the metal mask.

5. The method of claim 1, wherein the conductive fill material extends from a bottom-most surface of the barrier layer to a top surface of the adhesion layer.

6. The method of claim 1, wherein the conductive fill material physically contacts the insulating layer.

7. The method of claim 1, wherein the barrier layer is free of the adhesion layer.

8. The method of claim 1, wherein the sacrificial layer comprises benzotriazole (BTA).

9. A method comprising:
   forming a conductive feature in a first dielectric layer;
   depositing a second dielectric layer over the first dielectric layer;
   forming a patterned mask on the second dielectric layer;
   using the patterned mask, etching an opening in the second dielectric layer that exposes a surface of the conductive feature;
   depositing an adhesion layer on the exposed surface of the conductive feature, wherein the second dielectric layer is free of the adhesion layer;
   after depositing the adhesion layer, depositing a barrier layer on the patterned mask and on sidewalls of the opening, wherein a top surface of the adhesion layer is free of the barrier layer, wherein the barrier layer comprises nitrogen;
   performing a plasma treatment process on the barrier layer, wherein the plasma treatment process removes a portion of the nitrogen from the barrier layer; and
   depositing a conductive material on the adhesion layer, wherein the conductive material fills the opening.

10. The method of claim 9 further comprising, before depositing the conductive material on the adhesion layer, depositing a sacrificial material on the adhesion layer.

11. The method of claim 10, wherein the plasma treatment process removes the sacrificial material.

12. The method of claim 9 further comprising depositing a third dielectric layer over the first dielectric layer before depositing the second dielectric layer.

13. The method of claim 12, wherein the conductive material physically contacts a sidewall of the third dielectric layer.

14. The method of claim 9, wherein the conductive feature is free of the barrier layer.

15. The method of claim 12, wherein a thickness of the barrier layer is less than a thickness of the third dielectric layer.

16. A method comprising:
    depositing an etch stop layer over a metal line;
    depositing a dielectric layer over the etch stop layer;
    forming an opening through the etch stop layer and the dielectric layer, wherein the opening exposes the metal line;
    depositing a first adhesion material in the opening, wherein the first adhesion material selectively forms on the metal line;
    depositing a hydrophobic material in the opening, wherein the hydrophobic material covers the first adhesion material;
    depositing a metal nitride material in the opening, wherein the metal nitride material selectively bonds to the dielectric layer more than the metal nitride material bonds to the hydrophobic material;
    removing the hydrophobic material; and
    depositing a conductive material in the opening.

17. The method of claim 16, wherein a thickness of the first adhesion material is less than a thickness of the etch stop layer.

18. The method of claim 16, wherein the hydrophobic material forms chelation bonds with the first adhesion material.

19. The method of claim 16, wherein the conductive material separates the metal nitride material from the first adhesion material.

20. The method of claim 16 further comprising, after removing the hydrophobic material, depositing a second adhesion layer in the opening.

* * * * *